United States Patent

Kida et al.

Patent Number: 5,306,474
Date of Patent: Apr. 26, 1994

[54] APPARATUS FOR GROWING SINGLE CRYSTALS

[75] Inventors: Michio Kida; Yoshiaki Arai; Naoki Ono; Kensho Sahira, all of Omiya, Japan

[73] Assignee: Mitsubishi Materials Corporation, Tokyo, Japan

[21] Appl. No.: 921,896

[22] Filed: Jul. 29, 1992

[30] Foreign Application Priority Data

Jul. 30, 1991 [JP]  Japan .................. 3-190274

[51] Int. Cl.$^5$ .............................. C30B 15/12
[52] U.S. Cl. ..................... 422/249; 156/617.1; 156/DIG. 64; 156/DIG. 86; 156/DIG. 115
[58] Field of Search ............ 422/249; 156/617.1, 156/620.4, DIG. 64, DIG. 86, DIG. 115

[56]  References Cited

U.S. PATENT DOCUMENTS

| 2,892,739 | 6/1959 | Rusler ............... 156/DIG. 115 |
| 4,200,445 | 4/1980 | Bihuniak et al. ............ 65/18 |
| 4,246,064 | 1/1981 | Dewees et al. ........ 156/DIG. 115 |
| 4,352,784 | 10/1982 | Lin ................ 156/DIG. 115 |
| 4,456,499 | 6/1984 | Lin ................ 156/DIG. 115 |
| 4,478,675 | 10/1984 | Akai ................ 156/DIG. 83 |
| 4,609,425 | 9/1986 | Mateika et al. ........ 156/DIG. 83 |
| 4,944,834 | 7/1990 | Tada et al. ............ 156/620.4 |
| 5,037,503 | 8/1991 | Kajimoto et al. ...... 156/DIG. 115 |
| 5,053,359 | 10/1991 | Loxley et al. ............. 501/4 |

FOREIGN PATENT DOCUMENTS

| 0293865 | 12/1988 | European Pat. Off. . |
| 0294758 | 12/1988 | European Pat. Off. . |
| 0364899 | 4/1990 | European Pat. Off. . |
| 1055059 | 1/1967 | United Kingdom . |

Primary Examiner—Robert Kunemund
Attorney, Agent, or Firm—Scully, Scott, Murphy & Presser

[57]  ABSTRACT

An apparatus for growing a single crystal is disclosed which includes a double crucible assembly. The double crucible assembly has an outer crucible and an inner crucible disposed in the outer crucible. A support member is provided for supporting the inner crucible, and the support member is formed of an inorganic oxide non-reactive with silicon oxide. The upper end portion of the inner crucible may be formed of the same inorganic oxide. Alumina or mullite is suitable as the inorganic oxide. With the above construction, silicon single crystals obtained by the crystal growing apparatus will be free of contamination by carbon or heavy metals, and will exhibit excellent quality.

6 Claims, 6 Drawing Sheets

APPARATUS FOR GROWING SINGLE CRYSTALS

BACKGROUND OF THE INVENTION

The present invention relates to an apparatus for growing single crystals, which can prevent semiconductor single crystals from being contaminated by carbon or heavy metals during a drawing operation, and which further reduces crystal defect density within the grown semiconductor single crystals.

Known as one of the methods for growing single crystals of a semiconductor material such as silicon (Si) or gallium arsenide (GaAs) is a continuous Czochralski method which is a modification of a conventional Czochralski method. The continuous Czochralski method involves growing semiconductor single crystals while introducing raw material continuously into an outer crucible of a double crucible assembly, and is regarded as being the most suitable for growing long single crystals of large diameter.

A crystal growing apparatus to be used for carrying out the aforesaid continuous Czochralski method comprises a hermetically sealed container which is filled with an inert gas at a low pressure, a double crucible assembly of quartz ($SiO_2$) including inner and outer crucibles and placed in the container, a heat-resistant support member for releasing the inner crucible from the outer crucible and retaining the same above the outer crucible, and a heater for heating a semiconductor melt contained in the double crucible assembly.

In view of machinability and heat resistance, the aforesaid support member is suitably formed of a material having a high melting point such as molybdenum (Mo), tungsten (W), niobium (Nb), tantalum (Ta) or the like. Additionally, silicon nitride ($Si_3N_4$) or silicon carbide (SiC) may be used as the material for the double crucible assembly, and in that case, the support member may be formed of amorphous carbon (graphite).

For growing semiconductor single crystals using the aforesaid double crucible assembly, a prescribed amount of a semiconductor raw material is first introduced in the double crucible assembly, and an inert gas such as argon gas is introduced into the hermetically sealed container. Thereafter, while rotating the double crucible assembly, the semiconductor raw material is heated above a temperature of growth of single crystals and melted completely. Then, a seed crystal is immersed in the semiconductor melt and pulled vertically upwards while rotating the crucible assembly, whereby a semiconductor single crystal is grown.

Furthermore, as the crystal grows, a new charge of the semiconductor material of a prescribed amount corresponding to the growth of the single crystal, i.e., pulled amount, is continuously furnished into and melted in the outer crucible and transferred to the inner crucible.

In the aforesaid apparatus of single crystal growth, however, it has recently been found that the semiconductor melt or grown single crystals may be contaminated by the substances from which the support member is formed. More specifically, when growing silicon single crystals, acidic silicon oxide (SiO) vapor is produced from the silicon melt and graphite reacts therewith to produce carbon monoxide (CO), and this carbon monoxide causes lattice defects within the silicon single crystals which are being pulled. Furthermore, the material with high melting point such as molybdenum or tungsten is oxidized by the acidic SiO vapor, and the resulting oxides are captured in the silicon single crystals and cause minute crystal defects which are referred to as stacking faults.

The aforesaid contaminations by carbon or heavy metals have not been previously taken into consideration. However, due to the recent demands towards higher purity and uniform quality, the adverse effects of the contaminations on the characteristics of the silicon single crystals have become crucial and nonnegligible.

SUMMARY OF THE INVENTION

It is therefore the object of the present invention to provide an apparatus for growing single crystals, which can prevent resulting semiconductor single crystals from being contaminated by carbon or heavy metals during the pulling operation, and which further reduces crystal defect density within the grown semiconductor single crystals.

According to the present invention, there is provided an apparatus for growing semiconductor single crystals comprising:

a double crucible assembly including an outer crucible and an inner crucible disposed in the outer crucible; and a support member for supporting the inner crucible, the support member being formed essentially of an inorganic oxide having no deleterious influence on the characteristics of semiconductor single crystals.

In the above apparatus, since the support member is formed essentially of the inorganic oxide which has no deleterious influence on characteristics of semiconductor single crystals, the semiconductor single crystal which is being pulled up is prevented from being contaminated by carbon or heavy metals. In addition, even though the inorganic oxide should be dissolved into the semiconductor single crystals, the characteristics of the semiconductor single crystals will not be adversely affected by the oxide.

In the foregoing, it is preferable that the inner crucible be provided with an upper portion formed essentially of the aforesaid inorganic oxide. With this construction, the semiconductor single crystals to be pulled up are more certainly prevented from being contaminated by carbon and heavy metals.

Furthermore, alumina ($Al_2O_3$) or mullite ($3Al_2O_3 \cdot 2SiO_2$) is suitably selected as the above inorganic oxide for the following reasons.

Alumina is extremely thermally stable and excellent in thermal shock resistance, resistance to chemicals, wear resistance, and mechanical strength, and even though aluminum contained therein dissolves into the semiconductor single crystals, the characteristics of the semiconductor single crystals will not be adversely affected by aluminum. Furthermore, mullite exhibits a small coefficient of thermal expansion and a small reduction in strength at high temperature, and is excellent in thermal shock resistance, resistance to chemicals, wear resistance, and mechanical strength. In addition, even though aluminum contained therein dissolves into the semiconductor single crystals, the characteristics of the semiconductor single crystals will not be adversely affected.

DESCRIPTION OF THE PREFERRED EMBODIMENTS OF THE INVENTION

Figure 1:
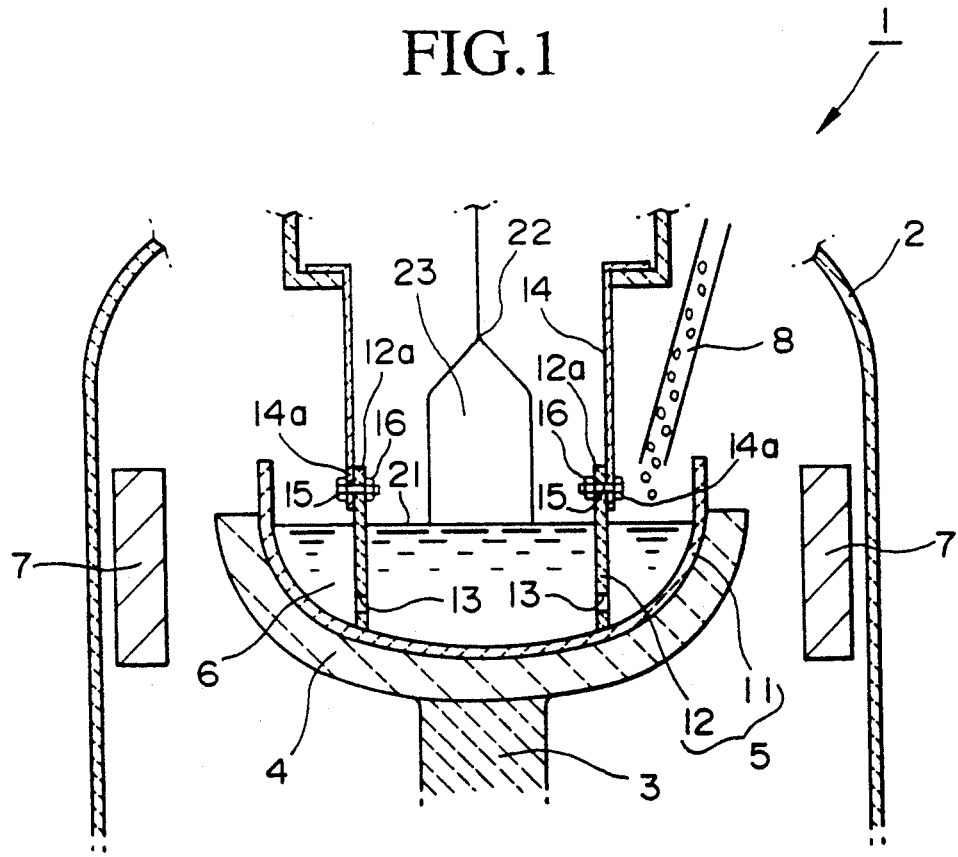
FIG. 1 is a schematic cross-sectional view of an apparatus for growing single crystals in accordance with a first embodiment of the invention.

FIG. 1 depicts an apparatus for growing single crystals in accordance with an embodiment of the invention.

The single-crystal growing apparatus, generally designated by 1, comprises a hermetically sealed container or furnace 2 which is filled with inert gas such as argon, a shaft 3 rotatable about a vertical axis thereof at a prescribed angular velocity, a graphite susceptor or support bowl 4 having a hemispherical inner surface and received immovably on the shaft 3, a double crucible assembly 5 received in the susceptor 4 with its outer surface being held in close contact with an inner surface of the susceptor, a heater 7 disposed around the susceptor 4 for heating a semiconductor melt contained in the double crucible assembly 5, and a feed assembly 8 for introducing a semiconductor raw material into the double crucible assembly 5.

The double crucible assembly 5 includes a quartz outer crucible 11 of a generally hemispherical shape, a quartz inner crucible 12 of a generally cylindrical shape disposed in the outer crucible 11. A plurality of apertures 13 for communicating the inner and outer crucibles are formed through a lower portion of the inner crucible 12 in circumferentially equally spaced relation to one another.

The upper end 12a of the inner crucible 12 is securely fixed to a lower end 14a of a generally cylindrical support member 14 by means of a plurality of bolts 15 and nuts 16. The support member 14, which has almost the same diameter as the inner crucible 12, is releasably supported by a driving device (not shown) and is moved up and down thereby, between an upper position where the inner crucible 12 secured to the support member 14 is shunted above the outer crucible 11 and a lower position where the support member 14 is released from the drive device and the inner crucible 12 secured thereto is received on the outer crucible 11.

The support member 14, the bolts 15, and the nuts 16 are formed essentially of an inorganic oxide which has no influence on characteristics of semiconductor single crystals. Any oxides which are stable with respect to the acidic silicon oxide vapor produced from the silicon melt 6 and which do not have any influence on the characteristics of single crystals, even though dissolved in the melt, may be employed as the above oxide. However, alumina ($Al_2O_3$) or mullite ($3Al_2O_3 \cdot 2SiO_2$) may be suitably selected.

In the foregoing, it is preferable that alumina or mullite have a purity of no less than 99.99%. Furthermore, inasmuch as the alumina is superior in moldability, alumina is more preferable in the case where precision working is particularly required.

The method for growing single crystals using the aforesaid crystal growing apparatus 1 will be hereinafter described.

First, the support member 14 is pulled upwards so that the inner crucible 12 is shunted above the outer crucible 11. Thereafter, the outer crucible 11 is charged with a prescribed amount of silicon raw material, and the hermetically sealed container 2 is evacuated to produce a vacuum. Then, inert gas such as argon gas is introduced into the container 2, and electric power is supplied to the heater 7 to heat the silicon material in the outer crucible 11 above the temperature of growth of single crystals and melts it completely while rotating the double crucible assembly 5 at a prescribed angular velocity by rotating the shaft 3 about its vertical axis.

Subsequently, the inner crucible 12 is located within the outer crucible 11 by moving down the support member 14, and the temperature of the silicon melt 6 near the central portion of the melt surface 21 is kept to the temperature of growth of single crystals by regulating the electric power supplied to the heater 7. Then, a silicon seed crystal 22 is immersed in the silicon melt 6 and is drawn upwards while rotating it about its vertical axis, to thereby grow a silicon single crystal 23.

As the silicon single crystal 23 grows, a new charge of silicon raw material in a prescribed amount corresponding to the growth of the single crystal, i.e., pulled amount, is continuously replenished into the outer crucible 11, and the replenished silicon material is melted in the outer crucible 11 and is continuously transferred through the apertures 13 into the inner crucible 12.

In the foregoing, since the material of the support member 14 is either alumina or mullite, the support member 14 is stable in an oxidizing atmosphere, and hence the silicon single crystal 23 to be pulled up will not be contaminated by carbon or heavy metals. In addition, even if the material dissolves into the silicon single crystal 23, this does not adversely affect the characteristics of the silicon single crystals. Therefore, silicon single crystals exhibiting reduced crystal defect density can be grown.

Figure 2:
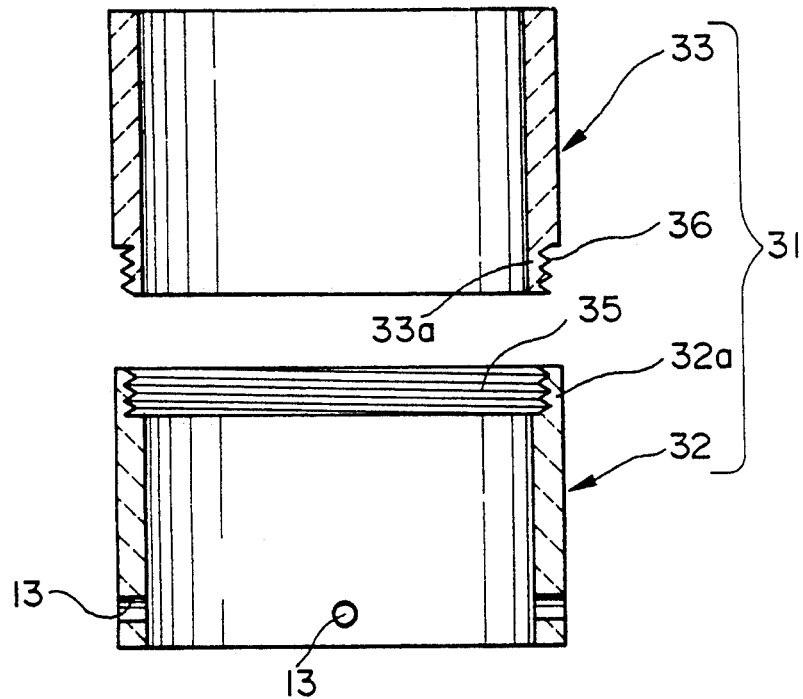
FIG. 2 is a schematic cross-sectional view showing a modified inner crucible of the apparatus for growing single crystals in accordance with the invention.
Figure 3:
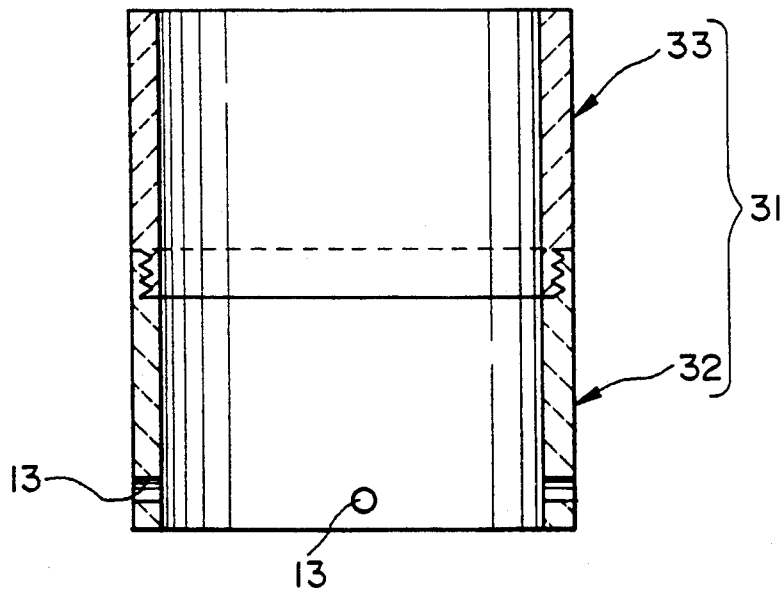
FIG. 3 is a view similar to FIG. 2, but showing the assembled inner crucible.

FIGS. 2 and 3 depict a modification of the inner crucible 12 used in the single crystal pulling apparatus. The modified inner crucible, designated by 31, includes a lower cylindrical member 32 of quartz and an upper cylindrical member 33 of alumina or mullite of the same diameter as the lower member 32. The lower cylindrical member 32 includes an internally threaded portion 35 formed at an upper end 32a thereof, while the upper cylindrical member 33 includes an externally threaded portion 36 formed at a lower end 33a thereof so as to be threadedly engaged with the internally threaded portion 32a of the lower cylindrical member 32. Thus, as best shown in FIG. 3, the upper cylindrical member 33 and the lower cylindrical member 32 are joined together by means of threaded engagement to form the inner crucible 31.

With the above construction, either alumina or mullite is selected as the material of the upper cylindrical member of the inner crucible 31. Therefore, the upper portion of the inner crucible 31, which the upper cylindrical member 33 defines, is made stable in the oxidizing atmosphere, and contamination of the silicon single crystals can be avoided. Accordingly, the crystal defect density within the silicon single crystal can be reduced, thereby enhancing the quality of the silicon single crystal. Furthermore, even though the above material dissolves into the silicon single crystals, the characteristics of the crystals will not be adversely affected.

Figure 4:
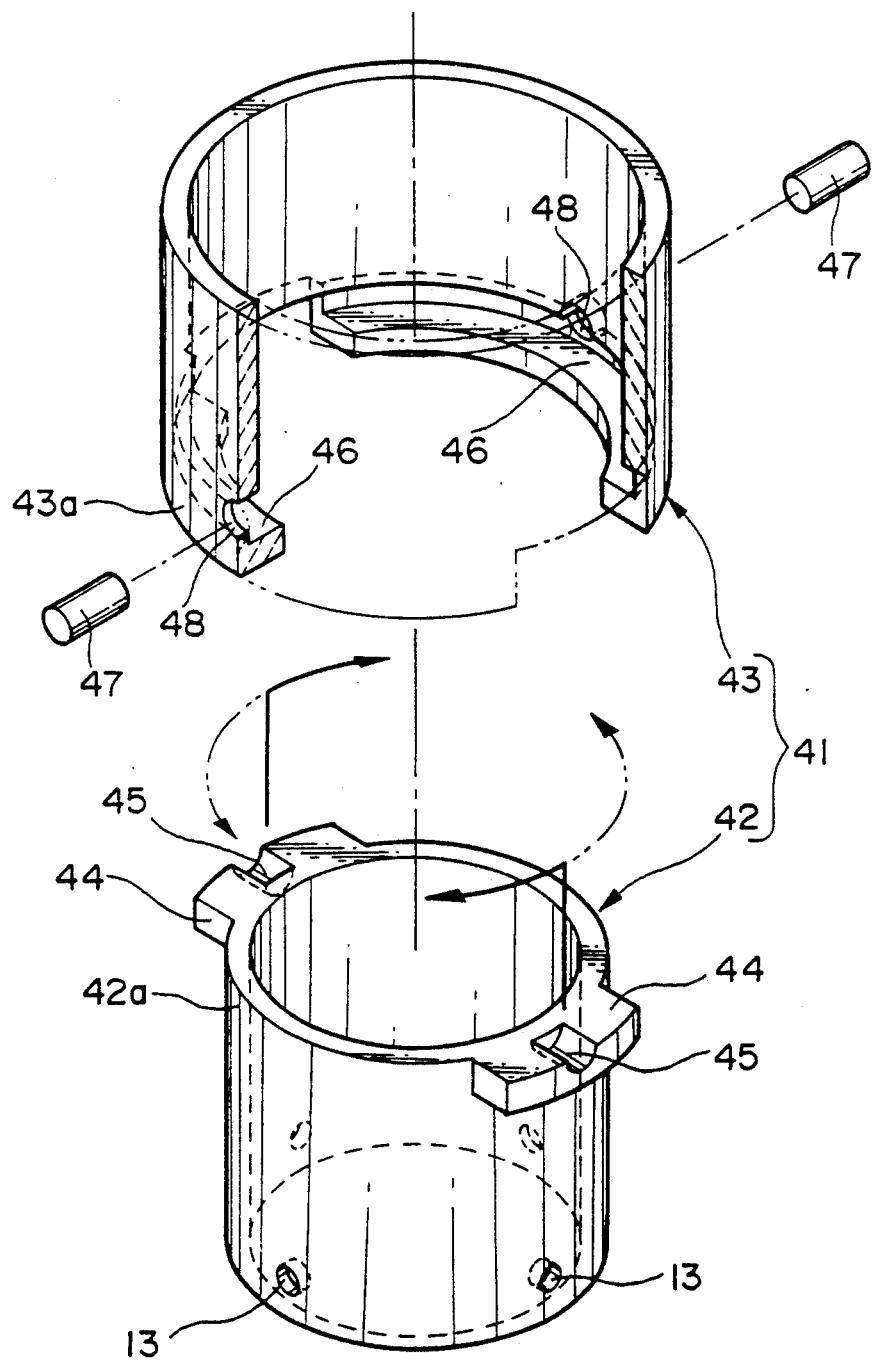
FIG. 4 is a partially cut-away perspective view showing another modified inner crucible of the apparatus for growing single crystals in accordance with the invention.
Figure 5:
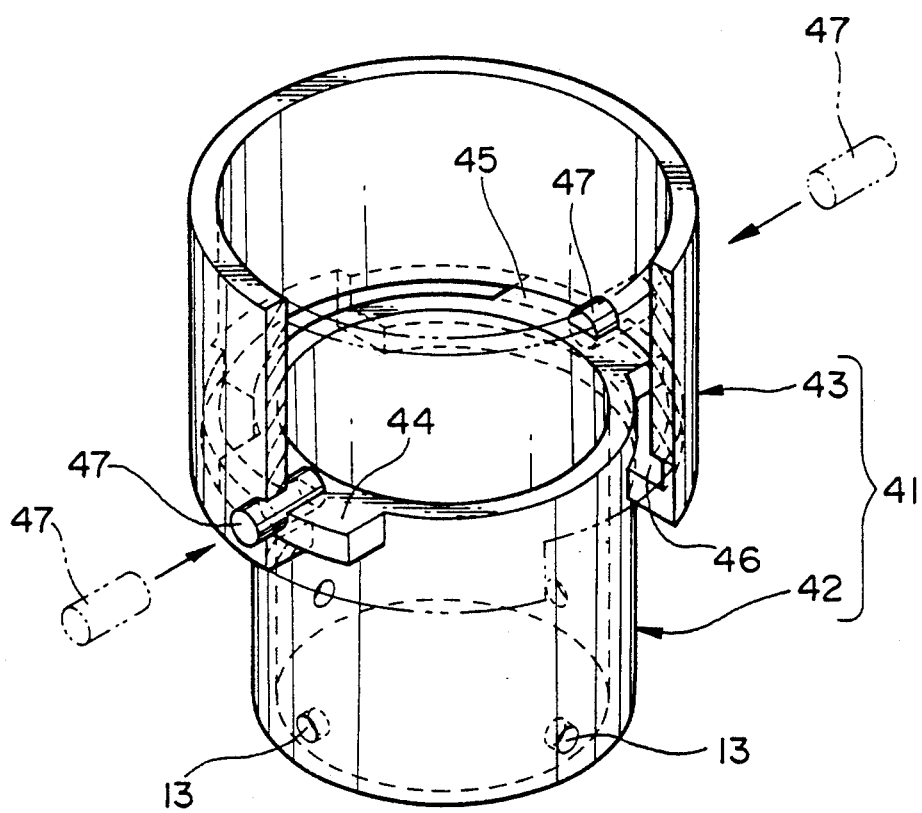
FIG. 5 is a view similar to FIG. 4, but showing the modified inner crucible in which upper and lower cylindrical members are connected together.

FIGS. 4 and 5 depict another modification of the inner crucible used in the single crystal pulling apparatus. As is the case with the above-mentioned inner crucible 31, this modified inner crucible, designated by 41, includes a lower cylindrical member 42 of quartz and an upper cylindrical member 43 of alumina or mullite. However, in the crucible 41, the upper cylindrical member 43 has a diameter greater than the lower cylindrical member 42, and the lower cylindrical member 42 includes a pair of radially outwardly protruding projections 44 and 44 formed at an upper end 42a thereof in diametrically opposed relation to each other. Each of the projections 44 has a groove 45 of a semicircular cross section formed at a central portion thereof so as to extend radially outwardly of the cylindrical member 42. Furthermore, the upper cylindrical member 43 includes a pair of radially inwardly protruding engaging portions 46 of an arcuate shape formed at a lower end 43a thereof so as to extend circumferentially thereof. In addition, the upper cylindrical member 43 has a pair of through holes 48 formed in diametrically opposed relation to each other and disposed adjacent to the engaging portions 46. These through holes 48 are adapted to receive a pair of engaging pins 47 which are used to join the engaging portions 46 of the upper cylindrical member 43 and the projections 44 of the lower cylindrical member 42.

For assembling the aforesaid upper and lower cylindrical members 43 and 42, the projections 44 and 44 of the lower cylindrical member 42 are first inserted from the lower side into the circumferential spaces between the engaging portions 46 and 46 of the upper cylindrical member 43. Then, the lower cylindrical member 42 is horizontally rotated approximately 90 degrees about its axis to cause the projections 44 and 44 to be driven on the engaging portions 46 and 46, respectively, until the grooves 45 and 45 of the projections 44 and 44 are brought into alignment with the through holes 48 and 48, respectively. Subsequently, the engaging pins 47 and 47 are inserted through the holes 48 and 48 and received by the grooves 45 and 45, respectively.

With the inner crucible 41 of the above construction, the same advantages as previously described can be obtained.

Figure 6:
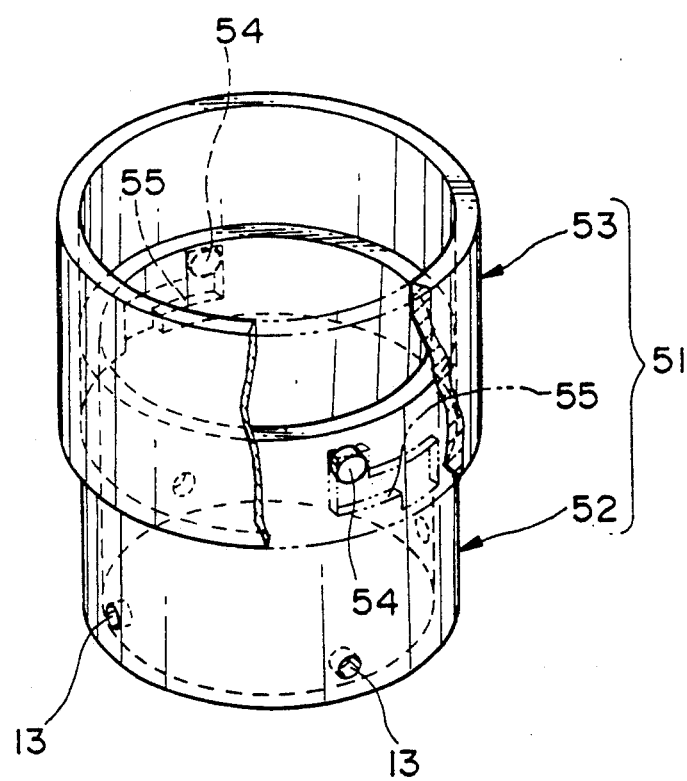
FIG. 6 is a partially cut-away perspective view showing a further modified inner crucible of the apparatus for growing single crystals in accordance with the invention.
Figure 7:
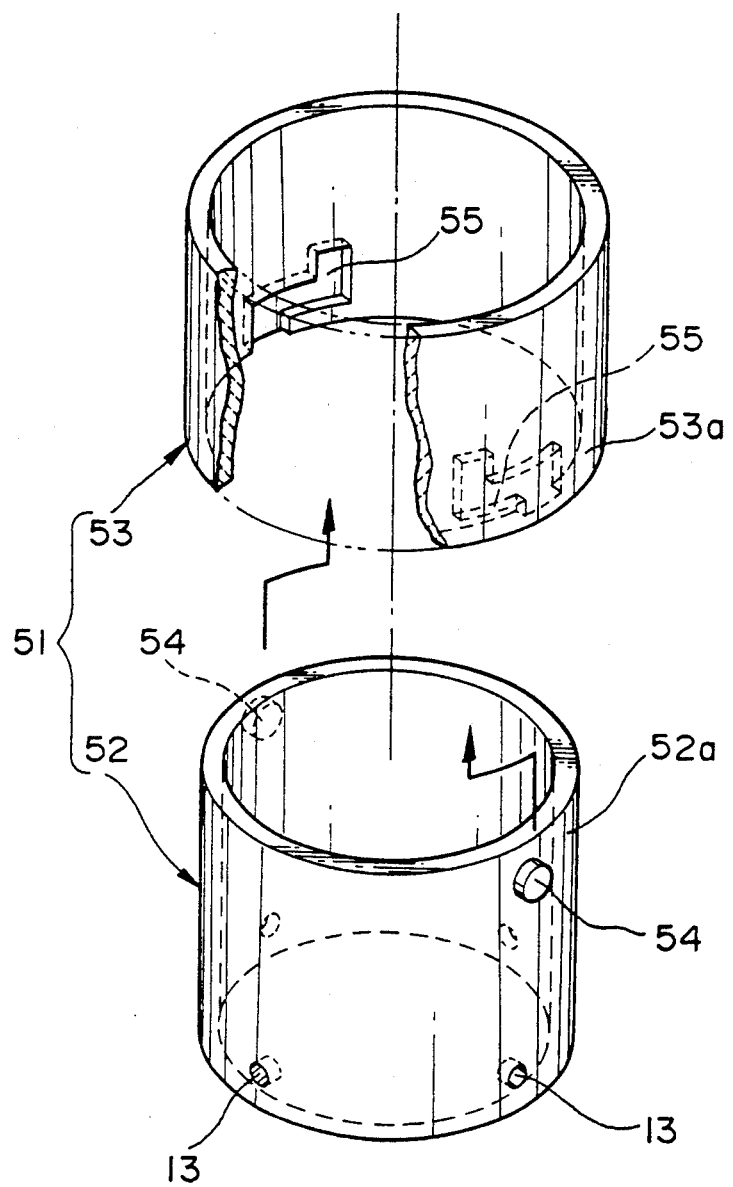
FIG. 7 is a view similar to FIG. 6, but showing the further modified inner crucible in which upper and lower cylindrical members are connected together.

FIGS. 6 and 7 depict a further modification of the inner crucible. As is the case with the above-mentioned inner crucible 41, this further modified inner crucible, designated by 51, includes a lower cylindrical member 52 of quartz (SiO$_2$) and an upper cylindrical member 53 of alumina or mullite of a diameter greater than the lower member 52. In this modification, the lower cylindrical member 52 includes a pair of radially outwardly protruding projections 54 and 54 formed at an upper end 52a thereof in diametrically opposed relation to each other. Furthermore, the upper cylindrical member 53 includes a pair of engaging grooves 55 formed in a lower end 53a thereof in diametrically opposed relation to each other. Each engaging groove 55 includes a first portion 55a extending upwardly, a second portion 55b extending from the upper end of the first portion 55a in a horizontal direction, and a third portion 55c extending upwardly from the second portion 55b.

For assembling the aforesaid upper and lower cylindrical members 53 and 52, the projections 54 and 54 of the lower cylindrical member 52 are first inserted from the lower side into the first portions of the engaging grooves 55 and 55. Then, the projections 54 and 54 of the lower cylindrical member 52 are moved through the second portions of the engaging grooves by rotating the upper and lower cylindrical members relative to each other, and then the projections are received in the upper ends of the third portions of the engaging grooves by moving down the upper cylindrical member 53.

As described above, in the single crystal growing apparatus in accordance with the invention, the support member or the like is formed of an inorganic oxide such as alumina or mullite. Therefore, the support member or the like is made stable in an oxidizing atmosphere, and contamination of the semiconductor single crystals can be avoided. Accordingly, the crystal defect density within the semiconductor single crystals can be reduced, thereby enhancing the quality of the semiconductor single crystals. Furthermore, even though the above material dissolves into the semiconductor single crystals, their characteristics will never be adversely affected.

Obviously, many modifications and variations of the present invention are possible in the light of the above teachings. It is therefore to be understood that within the scope of the appended claims, the invention may be practiced otherwise than as specifically described.

What is claimed is:

1. An apparatus for growing semiconductor single crystals comprising:
   a double crucible assembly including an outer crucible formed of quartz and an inner crucible disposed in said outer crucible, said inner crucible having an upper member, a lower member, and a connecting means for connecting said upper and lower members, said lower member being formed of quartz; and
   a support member for supporting said inner crucible;
   wherein said support member and said upper member are formed essentially of an inorganic oxide selected from the group consisting of alumina and mullite.

2. A single-crystal growing apparatus according to claim 1, wherein said inner crucible includes an upper cylindrical member defining said upper portion and a lower cylindrical member connected to said upper cylindrical member.

3. A single-crystal growing apparatus according to claim 2, wherein said upper cylindrical member has the same diameter as said lower cylindrical member, and wherein one of said upper cylindrical member and said lower cylindrical member has an internally threaded portion formed at one end thereof, and the other of said upper cylindrical member and said lower cylindrical member has an externally threaded portion formed at one end thereof so as to be threadedly engaged with said internally threaded portion of said one cylindrical member.

4. A single-crystal growing apparatus according to claim 2, wherein one of said upper cylindrical member and said lower cylindrical member has a diameter greater than the other, and wherein said other cylindrical member has a projection formed at one end thereof so as to protrude radially outwardly thereof, and said one cylindrical member has a radially inwardly protruding engaging portion formed at one end thereof so as to be engaged with said engaging portion of said other cylindrical member.

5. A single-crystal growing apparatus according to claim 4, wherein said projection has a groove formed in an upper surface thereof so as to extend radially of said other cylindrical member, said one cylindrical member having a through hole formed adjacent to said engaging portion, and further comprising an engaging pin adapted to be inserted through said through hole of said one cylindrical member and received by said groove of said other cylindrical member.

6. A single-crystal growing apparatus as recited in claim 2, wherein one of said upper cylindrical member and said lower cylindrical member has a diameter greater than the other, and wherein said one cylindrical member has an engaging groove formed at one end thereof, and said other cylindrical member has a radially outwardly protruding projection formed at one end thereof so as to be received in said engaging groove of said other cylindrical member.

* * * * *